(12) United States Patent
Lee et al.

(10) Patent No.: US 6,794,752 B2
(45) Date of Patent: Sep. 21, 2004

(54) BONDING PAD STRUCTURE

(75) Inventors: Ellis Lee, Taipei (TW); Yimin Huang, Taichung Hsien (TW); Tri-Rung Yew, Hsinchu Hsien (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/864,055

(22) Filed: May 23, 2001

(65) Prior Publication Data

US 2001/0022403 A1 Sep. 20, 2001

Related U.S. Application Data

(63) Continuation-in-part of application No. 09/595,496, filed on Jun. 16, 2000, which is a continuation of application No. 09/100,769, filed on Jun. 5, 1998, now Pat. No. 6,084,304.

(51) Int. Cl.[7] .................. H01L 23/48; H01L 23/52; H01L 29/40

(52) U.S. Cl. .................. 257/751; 257/762; 257/765
(58) Field of Search ................. 257/750–774, 257/734; 438/652–669

(56) References Cited

U.S. PATENT DOCUMENTS

| 5,723,822 A | * | 3/1998 | Lien .......................... 257/739 |
| 5,955,781 A | * | 9/1999 | Joshi et al. .................. 257/758 |
| 6,376,371 B1 | * | 4/2002 | Jain et al. .................... 438/681 |

* cited by examiner

*Primary Examiner*—Cuong Nguyen
(74) *Attorney, Agent, or Firm*—J.C. Patents

(57) ABSTRACT

An bonding pad structure has a passivation layer over a copper layer having a pad window to expose a portion of the copper layer, a barrier layer conformal to a profile of the pad window, and an aluminum pad located in the pad window. The metal layer can be an aluminum, aluminum alloy or aluminum dominated layer for providing a better adhesion property between the copper layer and the bonding wire.

10 Claims, 7 Drawing Sheets

BONDING PAD STRUCTURE

CROSS-REFERENCE TO RELATED APPLICATIONS

The present application is a continuation-in-part of an application Ser. No. 09/595,496, filed Jun. 16, 2000, entitled "STRUCTURE OF METALLIZATION", currently pending; which is a continuation of an application Ser. No. 09/100,769, filed Jun. 5, 1998, entitled "STRUCTURE OF METALLIZATION", currently granted (U.S. Pat. No. 6,084,304). All these applications are incorporated herein by reference.

BACKGROUND OF THE INVENTION

1. Field of the Invention

This invention relates in general to a metal interconnect, and more specifically relates to a bonding pad structure interposed between a copper layer and a bonding wire and a method for making the same.

2. Description of Related Art

As the requirement on the complexity and precision of an integrated circuit design keeps increasing in order to reduce the feature size of a semiconductor device and increase the integration of an integrated circuit, a semiconductor device has to contain more than two metal layers to achieve the fabrication of high-density metal interconnects on a limited surface of a chip. Conventionally, aluminum is used as the material of a metal layer. However, as the design rules of a semiconductor device get finer and higher, the requirements of lower resistivity and higher reliability increase as well. Since copper has better conductivity and reliability than that of aluminum, copper has become a new material used in the metal layers.

FIGS. 1A through 1C are the cross-sectional views showing a conventional metallization process. Referring to FIG. 1A, a number of copper interconnects are formed on a provided semiconductor substrate 10, wherein the semiconductor substrate 10 has some pre-formed devices, such as a transistor (not shown). A multi-interconnect layer 12 is used here to represent all formed copper interconnects. A top copper layer 14 is formed on the top of the multi-interconnect layer 12, and is surrounded by insulation layer 13.

Referring next to FIG. 1B, an insulation film 16 is deposited on the top of the top copper layer 14, preferably by a chemical vapor deposition (CVD) process, wherein the insulation film includes SiN or SiON. Then, a passivation layer 18 is formed on top of the insulation film 16, wherein the passivation layer 18 includes borophosphosilicate glass (BPSG), phosphosilicate glass (PSG), spin-on glass (SOG), or other dielectric materials. The preferable method for forming the passivation layer 18 is also a CVD process.

Referring to FIG. 1C, the passivation 18 and the insulation film 16 are patterned and etched through in sequence by a photolithography process and an etching process for forming a pad window 19 to expose the top copper layer 14.

The foregoing fabrication process for a top copper layer 14 tends to manifest an occurrence of oxidation on the copper layer before or during the next bonding process for connecting the top copper layer to a bonding wire, because the top copper layer 14 is exposed to the air. The oxidation of copper decreases the conductivity and the reliability of a copper interconnect, and further causes a short that might possibly damage the whole integrated circuit.

SUMMARY OF THE INVENTION

According to the foregoing description, it is therefore an objective of the invention to provide a bonding pad structure and method for making the same, for providing a better adhesion property between the copper layer and the bonding wire.

According to the object mentioned above, the invention provides a bonding pad structure. A passivation layer over a copper layer has a pad window to expose a portion of the copper layer. A barrier layer is conformal to a profile of the pad window. And an aluminum pad is located in the pad window. Thereby, a better adhesion property is provided between the copper layer and the bonding wire.

In regard to the structure above, the invention provides a method for manufacturing an interconnection structure as follows. A substrate with a copper layer over the substrate is provided. A passivation layer is formed over the copper layer and then a pad window is formed within the passivation to expose a portion of the copper layer. A barrier layer is formed over the passivation layer and the pad window. After a portion of the barrier layer over the passivation layer is removed, a metal layer is formed over the passivation layer and filled in the pad window. A portion of the metal layer is removed to expose the passivation layer. Preferably, the metal layer is an aluminum layer. The portion of the metal layer can be removed by a chemical mechanical polishing (CMP) process, or an etching process.

The invention further provides another method for manufacturing an interconnection structure above as follows. First, a substrate with a copper layer over the substrate is provided, and a passivation layer is formed over the copper layer. A pad window within the passivation layer is formed to expose a portion of the copper layer. A barrier layer is formed over the passivation layer and the pad window and then a metal layer is formed over the barrier layer and filled in the pad window. A portion of the metal layer and the barrier layer is removed to expose the passivation layer. Preferably, the metal layer is an aluminum, aluminum alloy or aluminum dominated layer. The portion of the metal layer and the barrier layer can be removed by a chemical mechanical polishing (CMP) process, or an etching process.

The invention further provides a bonding pad structure. A passivation layer is located over a copper layer having a pad window to expose a portion of the copper layer. A barrier layer is conformal to a profile of the pad window and extended along the surface of the passivation layer from the pad window. And an aluminum pad is located over the barrier layer.

The invention also provides a method for manufacturing an interconnection structure above, comprising steps as follows. A substrate with a copper layer over the substrate is provided. A passivation layer is formed over the copper layer, and a pad window is formed within the passivation layer to expose a portion of the copper layer. A barrier layer is then formed over the passivation layer and the pad window. A metal layer is formed over the barrier layer and filled in the pad window. Next, a photoresist layer is formed over the metal layer, wherein the photoresist layer has a pattern covering the pad window. A portion of the metal layer and the barrier layer are removed to expose the passivation layer. And the photoresist layer is removed. Preferably, the metal layer is an aluminum layer. The portion of the metal layer and the barrier layer can be removed by an etching process.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

In order to have a better adhesion property between a copper layer and a bonding wire in subsequent process, the invention provides a bonding pad structure using aluminum, aluminum alloy or aluminum dominated layer. Therefore, the adhesion and conductivity properties between the copper layer and the bonding wire are significantly improved. In general, the bonding wire is a gold wire and copper is easily oxidized, causing a poor adhesion property between the copper layer and the bonding wire. Therefore, an aluminum, aluminum alloy or aluminum dominated boding pad interposed between the copper layer and the bonding wire can provide an excellent adhesion property without copper oxidation issue. According to the invention, two preferable bonding pad structures and their corresponding manufacturing processes are disclosed.

Figure 3A:
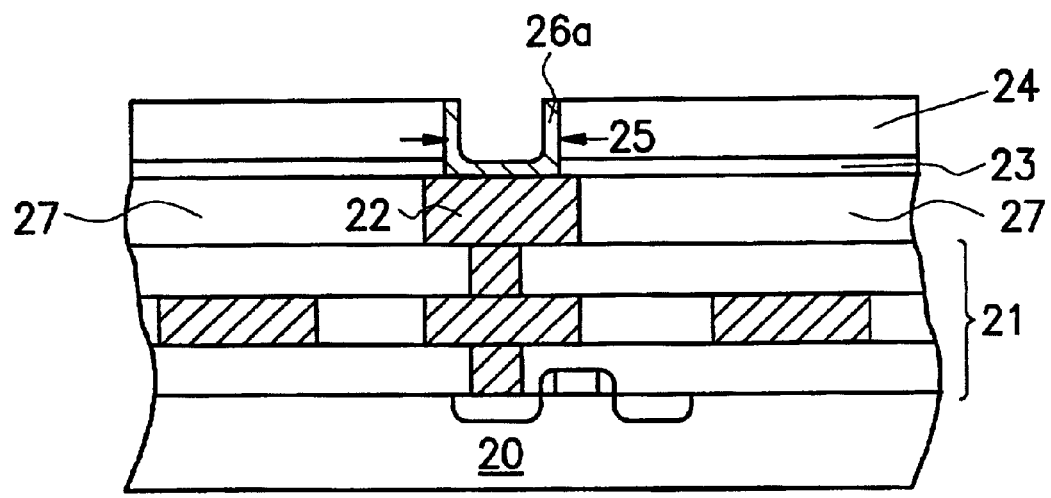
FIGS. 3A through 3C are cross-sectional views showing manufacturing process of the metallization according to the one embodiment of the invention.
Figure 3B:
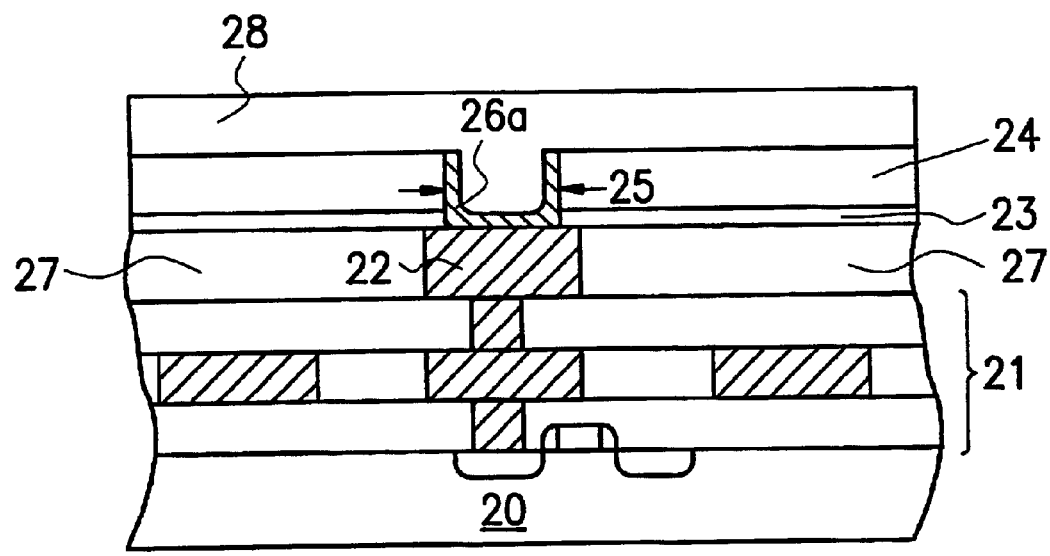
Figure 3C:
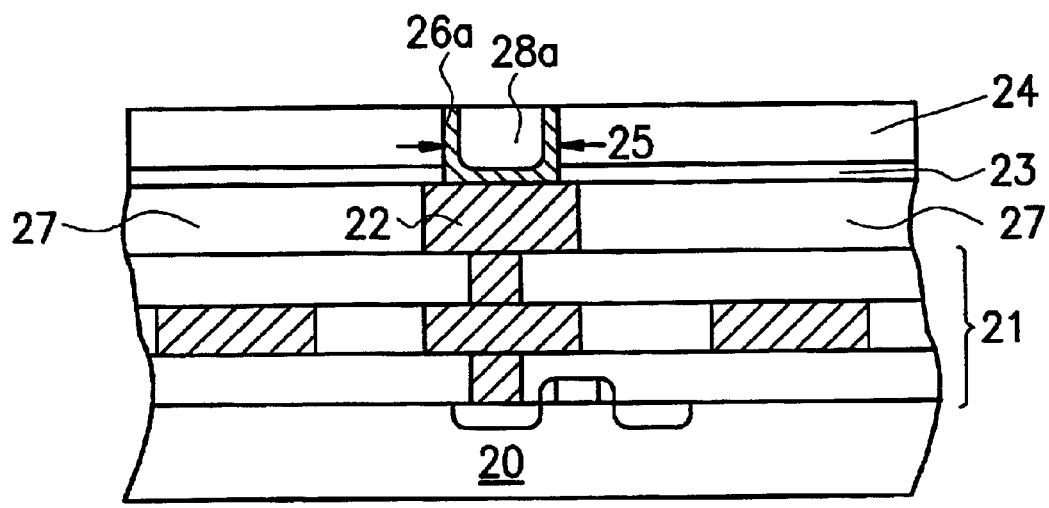
Figure 3D:
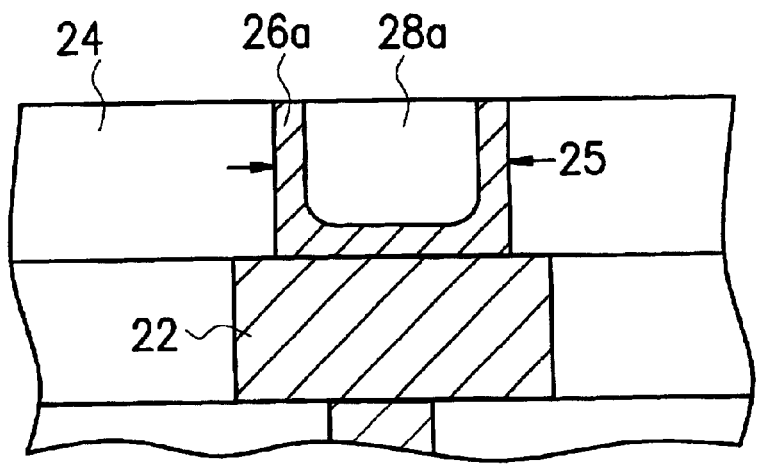
FIG. 3D schematically shows one bonding pad structure according to the embodiment of the invention.

First, referring to FIG. 3D, it schematically shows a bonding pad structure according to the invention. As shown, the bonding pad structure comprises a copper layer 22, a passivation layer 24 over the copper layer having a pad window 25 to expose a portion of the copper layer 22, a barrier layer 26a conformal to a profile of the pad window 25; and an aluminum pad 28a located in the pad window. The aluminum pad 28a can provide a better adhesive property between the copper layer 22 and the other conductive layer in subsequent process. Two exemplary methods for making the structure in FIG. 3D are described in detail as follows.

Figure 5A:
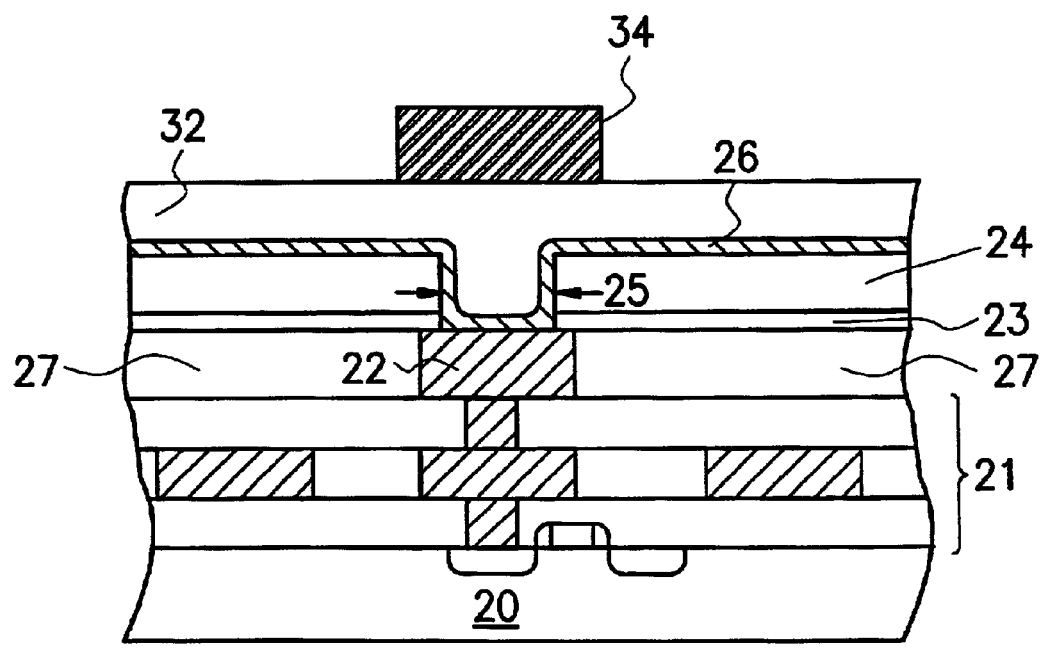
FIGS. 5A through 5B are cross-sectional views showing a manufacturing process of the bonding pad structure according to another embodiment of the invention.
Figure 5B:
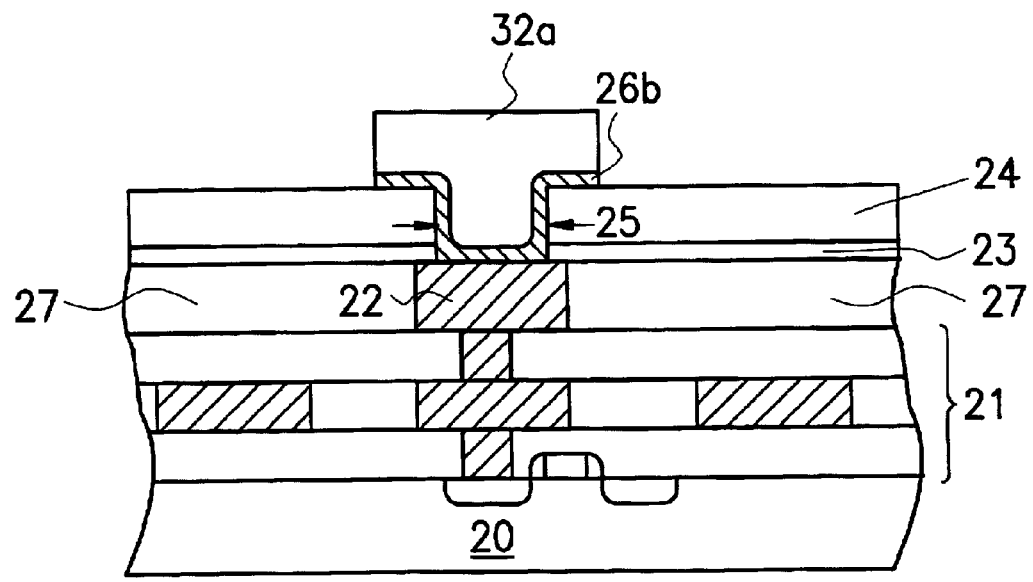
Figure 5C:
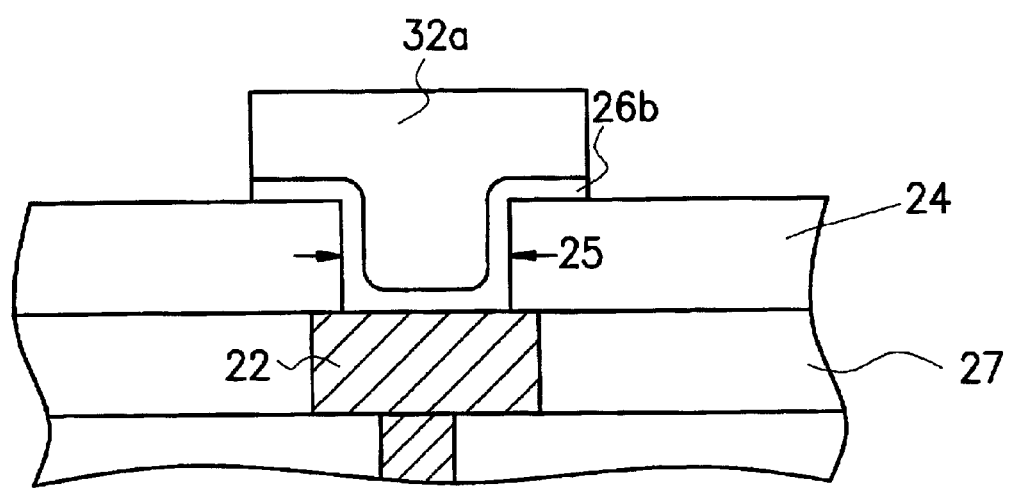
FIG. 5C schematically shows another bonding pad structure according to another embodiment of the invention.

In addition, FIG. 5C schematically shows another bonding pad structure according to the invention. As shown, a copper layer 22 is located within an insulating layer 27. A passivation layer 24 is located over the copper layer and has a pad window 25 to expose a portion of the copper layer 22. A barrier layer 26b is conformal to a profile of the pad window 25 and extended along the surface of the passivation layer 24 from the pad window 25. An aluminum pad 32a is located over the barrier layer.

Figure 1A:
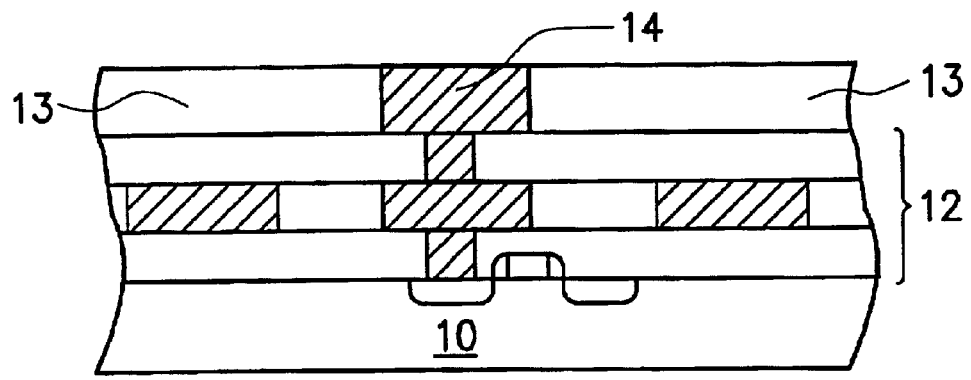
FIGS. 1A through 1C are cross-sectional views showing a conventional metallization process.
Figure 1B:
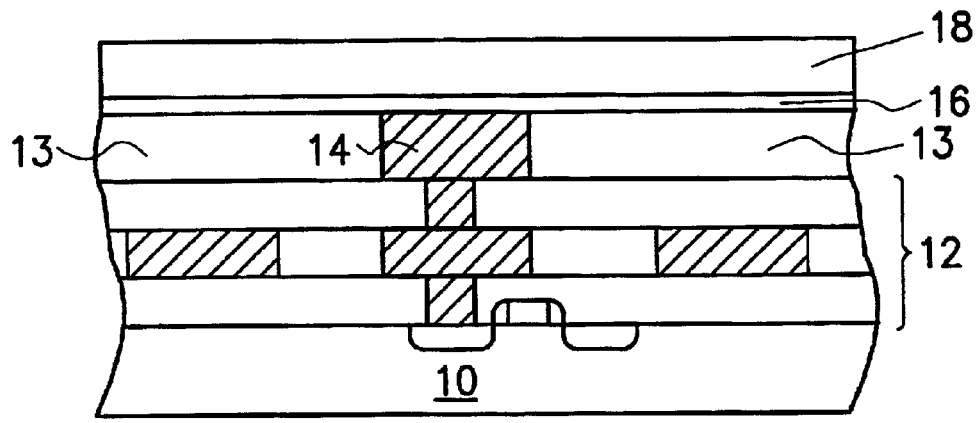
Figure 1C:
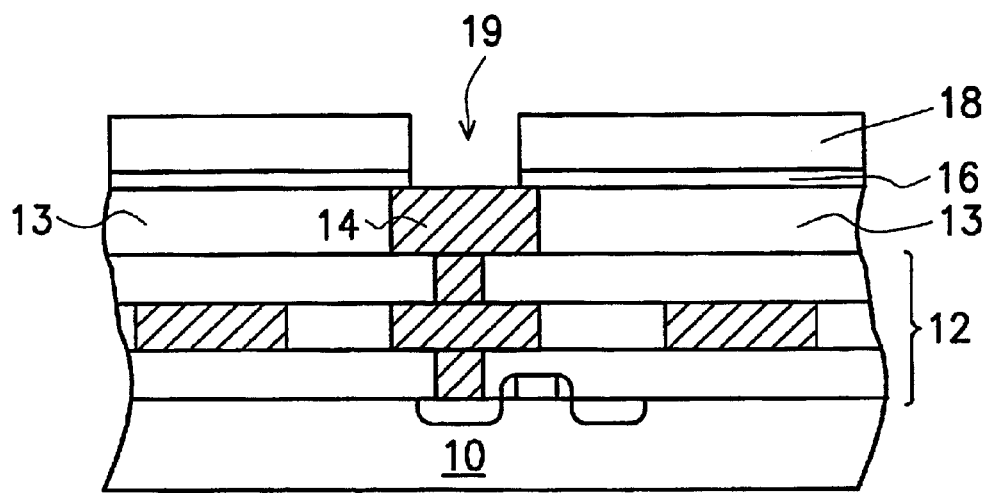
Figure 2A:
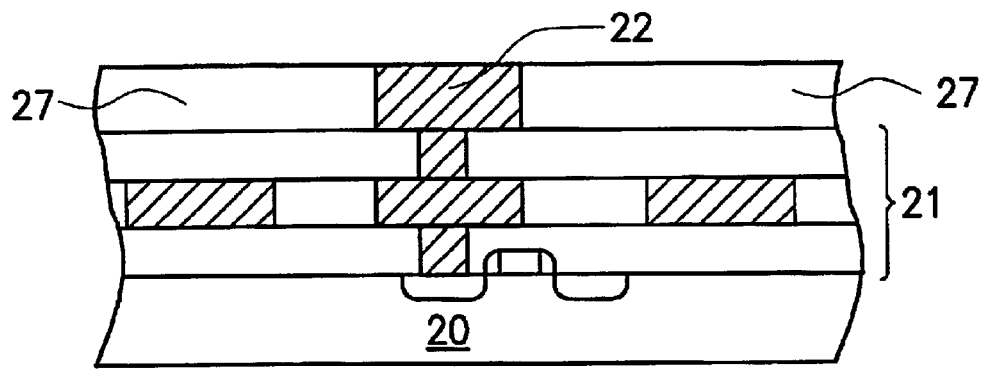
FIGS. 2A through 2D are cross-sectional views showing an anti-oxidation process for the top copper layer in a preferred embodiment according to the invention.

FIGS. 2A through 2D and FIGS. 3A through 3C schematically show a manufacturing process for making the bonding pad structure in FIG. 3D. Referring to FIG. 2A, a number of metal interconnects are formed on a provided semiconductor substrate 20, wherein the semiconductor substrate has a number of pre-formed devices including metal layers (not shown) and transistors (not shown). A multi-interconnect layer 21 is used in the diagram to represent the pre-formed metal interconnects. A copper layer 22 is used to connect to a bonding wire.

Figure 2B:
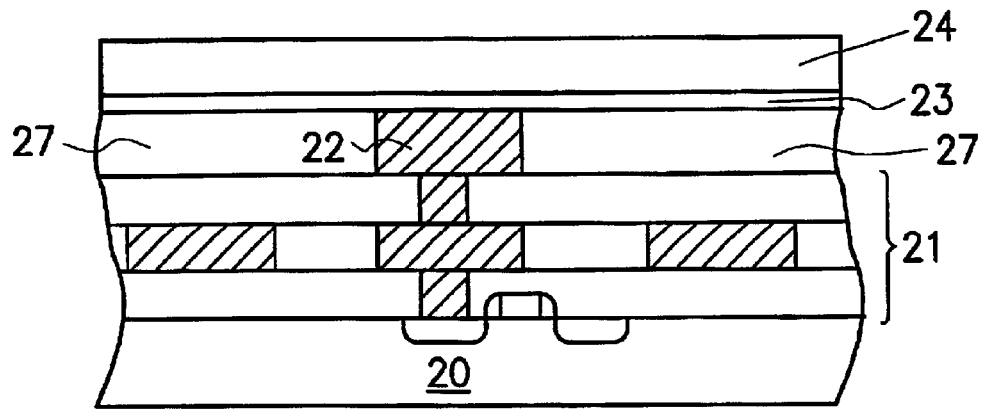

In FIG. 2B, a cap layer 23 is formed on the copper layer 22. The cap layer 23 comprises SiN or SiON. A preferable process to form the cap layer 23 comprises a CVD process. Then, a passivation layer 24 is formed over the cap layer 23. The passivation layer 24 comprises BPSG, PSG, SiN, doped oxide, undoped oxide or combination thereof, and a preferable method for forming the passivation layer 24 is a CVD process, for example.

Figure 2C:
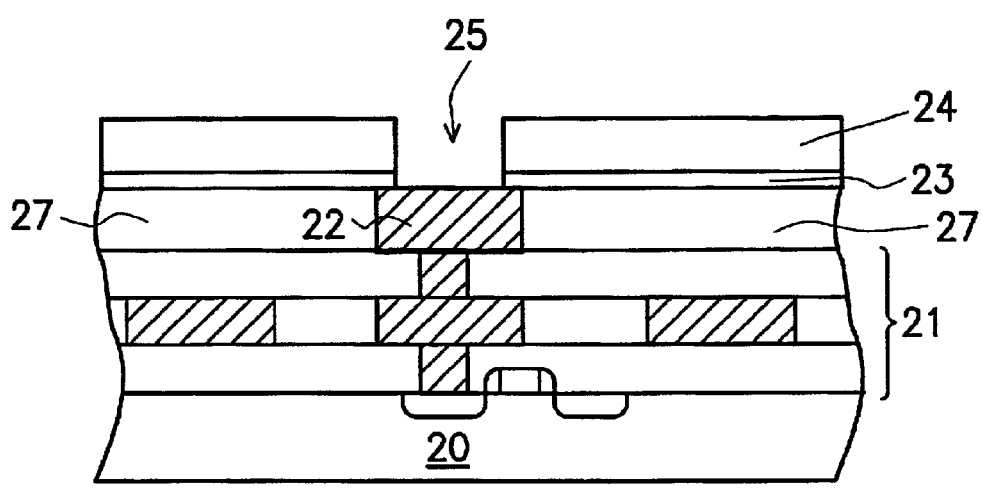

Referring to FIG. 2C, a photolithography process and an etching process are performed to pattern and etch through the passivation layer 24 and the cap layer 23 in sequence to form a pad window 25 to expose a portion of the copper layer 22.

Figure 2D:
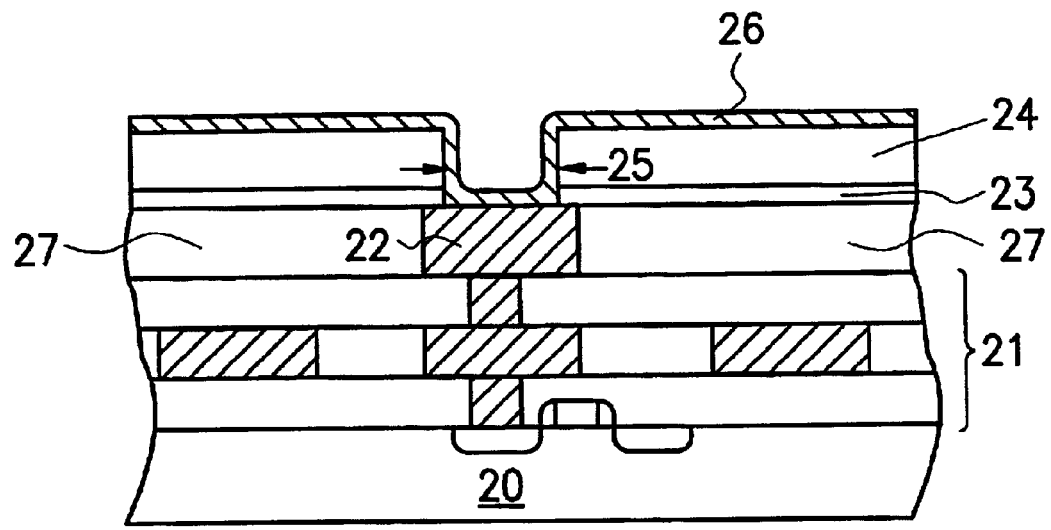

Referring to FIG. 2D, a barrier layer 26, such as a thin conductive film 26, is formed over the passivation layer 24 and in the pad window 25, wherein the barrier layer 26 comprises material, such as aluminum (Al), tantalum (Ta), tantalum nitride (TaN), titanium nitride (TiN), and tungsten nitride (WN) thereof, mixtures thereof, combinations thereof and alloys thereof The barrier layer 26 can protect the copper layer 22 from exposure to the air. The method for forming the barrier layer 26 comprises a sputtering process or a CVD process, for example.

Referring next to FIG. 3A, a portion of the barrier layer 26 over the passivation layer 24 is removed to expose the passivation layer 24. For example, a chemical mechanical polishing (CMP) process can be used. Then, the exposed copper layer 22 and the sidewall of the pad window 25 are covered by the barrier layer 26a. In FIG. 3B, a metal layer 28 is formed over the passivation layer 24 and thus filled the pad window 25. For example, a CVD process or a sputtering process or any other applicable process in the art can be used to form the metal layer 28. Preferably, the metal layer 28 is an aluminum, aluminum alloy or aluminum dominated layer for preventing the copper oxidation issue. Referring to FIG. 3C, a planarization process is performed to remove a portion of the metal layer 28 and only the portion 28a in the pad window 25 is remained for serving as a bonding pad. In general, a CMP or an etching back process can be used to planarize the metal layer 28 and stops at the passivation layer 24.

FIGS. 2A through 2D and FIGS. 4A through 4B schematically show another manufacturing process for making the bonding pad structure in FIG. 3D. The processes in FIGS. 2A through 2D are the same, and therefore no redundant description is made herein after.

Figure 4A:
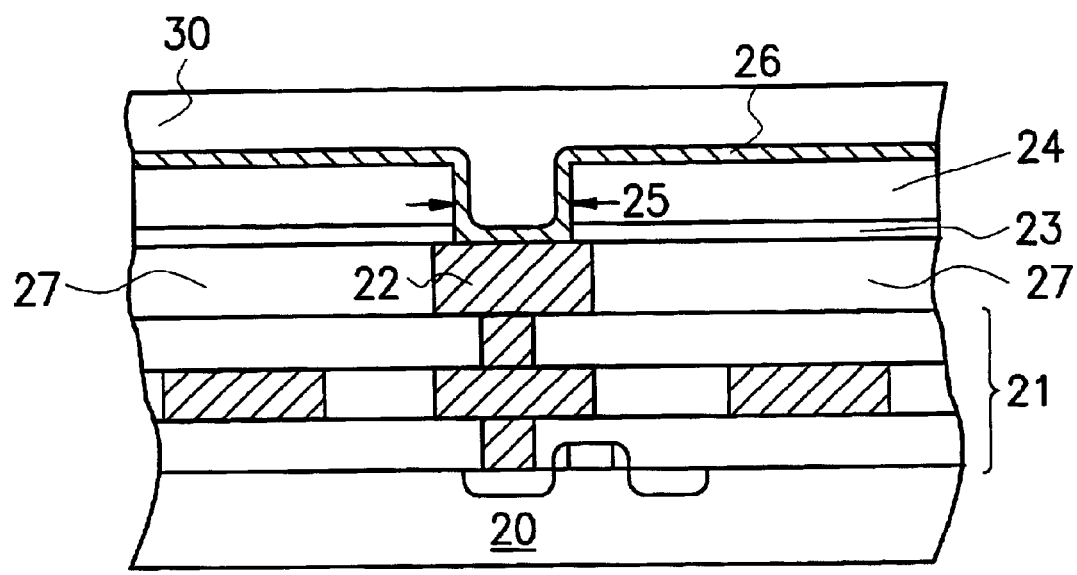
FIGS. 4A through 4B are cross-sectional views showing another manufacturing process for making the bonding pad structure shown in FIG. 3D according to the embodiment of the invention.
Figure 4B:
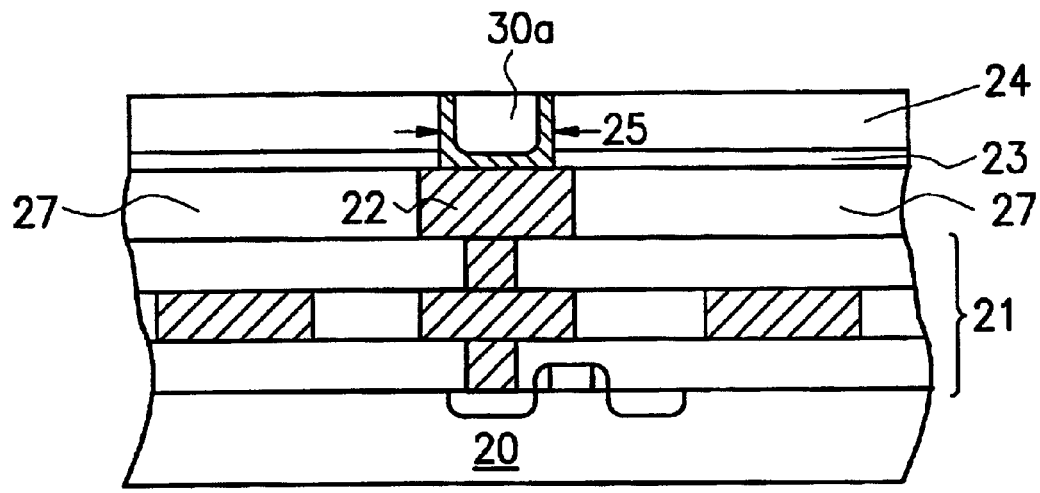

Referring next FIG. 4A, a metal layer 30 is formed over the passivation layer 24 and thus filled the pad window 25. For example, a CVD process or a sputtering process or any other applicable process in the art can be used to form the metal layer 30, and preferably, the metal layer 30 is an aluminum, aluminum alloy or aluminum dominated layer for providing a better adhesion property between the copper layer 22 and the bonding wire. Referring to FIG. 4B, a planarization process is performed to remove a portion of the metal layer 30 and the underlying barrier layer 26, and only the portion 30a in the pad window 25 is remained for serving as a bonding pad. In general, a CMP or an etching back process can be used to remove the metal layer 28 and the underlying barrier layer 26 and stop at the passivation layer 24.

FIGS. 3A through 3C and FIG. 4A through 4B show two examples for making the structure in FIG. 3D. It should be noticed that for those skilled in the art the structure in FIG. 3D can be made by modifying the processes shown in FIGS. 2A through 2D and FIGS. 3A through 3C, or in FIGS. 2A through 2D and FIGS. 4A through 4B.

FIGS. 2A through 2D and FIGS. 5A through 5B provide an exemplary manufacturing process for making the bonding pad structure in FIG. 5C. The processes in FIGS. 2A through 2D are the same as the first embodiment. No redundant description is made hereinafter.

Referring to FIG. 5A, after the process in FIG. 2D is finished, a metal layer 32 is formed over the barrier layer 26 and filled into the pad window 25, by depositing a metal layer using a CVD or a sputtering process or any other applicable process in the art. The metal layer 32 comprises material of aluminum (Al), aluminum alloy or aluminum dominated layer, for example. A photoresist layer 34 is then formed over the metal layer 32 at a position substantially corresponding the location above the pad window 25. For certain purposes, the width of the photoresist layer 34 is larger the width of the pad window 25.

Referring to FIG. 5B, a portion of the metal layer 34 together with the underlying barrier layer 26 are removed using the photoresist layer 34 as a mask. In general, an etching process, such as a dry or wet etching process, can be used to complete the removals of the metal layer 34 and the underlying barrier layer 26. The remaining barrier layer 26b extends along the surface of the passivation layer 24, and a bonding pad 32a is formed to electrically connect the underlying copper layer 22. The bonding pad 32a can provide a better adhesion property between the copper layer 22 and the bonding wire.

It should be noticed that for those skilled in the art the structure in FIG. 5C can be made by modifying the processes shown in FIGS. 2A through 2D and FIGS. 5A through 5B.

In addition to the forgoing aluminum bonding pad, a contact bump structure can be typically formed over the pad window for enhanced adhesion. The contact bump structure is substantially a round or circular profile. Therefore, the invention can provide a chip with a ball grad array (BGA) structure.

According to the foregoing, the metallization process and the bonding pad structure provided by the invention can prevent the copper layer from oxidation, so that the conductivity remains excellent after the following bonding process, and the stability of device is improved. Furthermore, the aluminum bonding pad provides a better adhesion property between the copper layer and the bonding wire, and prevents the copper oxidation issue. The process of the invention can be accomplished by existing techniques, so no extra machines are required.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A boding pad structure, comprising:
   a copper interconnect structure having multi-layer interlevel dielectric layers and copper interconnects in the multi-layer interlevel dielectric layers;
   a passivation layer over the copper interconnect structure having a pad window to expose a portion of the copper interconnects;
   a barrier layer conformal to a profile of the pad window; and
   an aluminum pad located in the pad window, wherein the aluminum pad is exposed by the passivation layer and is only deposited inside the pad window.

2. The bonding pad structure of claim 1, wherein the barrier layer is selected from the group consisting of aluminum (Al), tantalum (Ta), tantalum nitride (TaN), titanium nitride (TiN), and tungsten nitride (WN), mixtures thereof, combinations thereof and alloys thereof.

3. The bonding pad structure of claim 1, wherein the aluminum pad is an aluminum, aluminum alloy or aluminum dominated layer.

4. The bonding pad structure of claim 1, wherein the aluminum pad located in the pad window is connected with a bonding wire.

5. The bonding pad structure of claim 1, wherein the aluminum pad located in the pad window is connected with solar ball.

6. A bonding pad structure, comprising:
   a copper interconnect structure having multi-layer interlevel dielectric layers and copper interconnects in the multi-layer interlevel dielectric layers;
   a passivation layer over the copper interconnect structure having a pad window to expose a portion of the copper interconnects;
   a barrier layer conformal to a profile of the pad window and extended along a portion of the surface of the passivation layer surrounded the pad window; and
   an aluminum pad located over the barrier layer, wherein the aluminum pad is disposed only inside the pad window and over a portion of the surface of the passivation layer surrounding the pad window.

7. The bonding pad structure of claim 6, wherein the barrier layer is selected from the group consisting of aluminum (Al), tantalum (Ta), tantalum nitride (TaN), titanium nitride (TiN), and tungsten nitride (WN), mixtures thereof, combinations thereof and alloys thereof.

8. The bonding pad structure of claim 6, wherein the aluminum pad is an aluminum, aluminum alloy or aluminum dominated layer.

9. The bonding pad structure of claim 6, wherein the aluminum pad located in the pad window is connected with a bonding wire.

10. The bonding pad structure of claim 6, wherein the aluminum pad located in the pad window is connected with solar ball.

* * * * *